United States Patent
Chen et al.

(10) Patent No.: US 10,510,668 B1
(45) Date of Patent: Dec. 17, 2019

(54) METHOD OF FABRICATING SEMICONDUCTOR DEVICE

(71) Applicant: Taiwan Semiconductor Manufacturing Co., Ltd., Hsinchu (TW)

(72) Inventors: Jie Chen, New Taipei (TW); Hsien-Wei Chen, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/035,704

(22) Filed: Jul. 16, 2018

(51) Int. Cl.
*H01L 23/538* (2006.01)
*H01L 21/56* (2006.01)
*H01L 23/04* (2006.01)
*H01L 23/00* (2006.01)
*H01L 25/065* (2006.01)
*H01L 21/762* (2006.01)
*H01L 21/48* (2006.01)
*H01L 21/52* (2006.01)
*H01L 21/20* (2006.01)

(52) U.S. Cl.
CPC .......... *H01L 23/5384* (2013.01); *H01L 21/56* (2013.01); *H01L 21/762* (2013.01); *H01L 23/04* (2013.01); *H01L 24/06* (2013.01); *H01L 25/0652* (2013.01); *H01L 21/2007* (2013.01); *H01L 21/481* (2013.01); *H01L 21/4803* (2013.01); *H01L 21/52* (2013.01); *H01L 2924/161* (2013.01); *H01L 2924/1616* (2013.01); *H01L 2924/16151* (2013.01); *H01L 2924/16171* (2013.01); *H01L 2924/16251* (2013.01); *H01L 2924/3511* (2013.01)

(58) Field of Classification Search
CPC ... H01L 21/4803; H01L 21/52; H01L 21/481; H01L 21/2007; H01L 2924/3511; H01L 2924/16151; H01L 2924/161; H01L 2924/1616; H01L 2924/16171; H01L 2924/16251
USPC ................................. 438/455–459
See application file for complete search history.

(56) References Cited

U.S. PATENT DOCUMENTS

| | | | | |
|---|---|---|---|---|
| 6,900,531 B2 * | 5/2005 | Foong | ............... | H01L 27/14618 257/100 |
| 7,728,440 B2 * | 6/2010 | Honda | .................. | H01L 21/563 257/704 |
| 7,951,643 B2 * | 5/2011 | Ha | ...................... | H01L 21/4853 438/106 |
| 8,001,930 B2 * | 8/2011 | Bosma | .................... | A01J 5/048 119/14.43 |
| 8,143,110 B2 * | 3/2012 | Karpur | .................. | H01L 21/563 438/127 |
| 8,354,304 B2 * | 1/2013 | Chow | .................. | H01L 21/561 257/774 |

(Continued)

*Primary Examiner* — David A Zarneke
(74) *Attorney, Agent, or Firm* — JCIPRNET

(57) ABSTRACT

A method of fabricating a semiconductor device is provided. A hybrid bonded structure is provided. A cover lid comprising a base portion and at least one dummy portion protruding from the base portion is provided. The at least one dummy portion of the cover lid is bonded to the hybrid bonding structure. The base portion is removed. A redistribution structure over the hybrid bonding structure and the at least one dummy portion is formed.

20 Claims, 16 Drawing Sheets

(56) References Cited

U.S. PATENT DOCUMENTS

| | | | |
|---|---|---|---|
| 8,685,837 B2 * | 4/2014 | Mitani | H01L 21/2007 |
| | | | 257/E21.567 |
| 8,975,757 B2 * | 3/2015 | Ueshima | B23K 35/262 |
| | | | 257/738 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,589,840 B2 * | 3/2017 | Kao | H01L 21/76898 |
| 9,655,939 B2 * | 5/2017 | Reeve | A01N 65/00 |
| 9,941,180 B2 * | 4/2018 | Kim | H01L 21/561 |
| 10,192,843 B1 * | 1/2019 | Pachamuthu | H01L 24/20 |
| 2017/0084589 A1 * | 3/2017 | Kuo | H01L 25/105 |
| 2017/0221830 A1 * | 8/2017 | Scanlan | H01L 24/97 |
| 2017/0317017 A1 * | 11/2017 | Ishihara | H01L 23/49822 |
| 2018/0261535 A1 * | 9/2018 | Lin | H01L 23/36 |
| 2018/0261573 A1 * | 9/2018 | Chen | H01L 21/56 |

* cited by examiner

METHOD OF FABRICATING SEMICONDUCTOR DEVICE

BACKGROUND

Chip-On-Wafer-On-Substrate (CoWoS) packaging technology facilitating power-efficient high speed computing while reducing heat emissions has been developed. In the packaging process of CoWoS package, top dies are boned on an interposer wafer, thereby dummy dies are utilized and bonded adjacent the active dies to reduce the warpage of the package structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
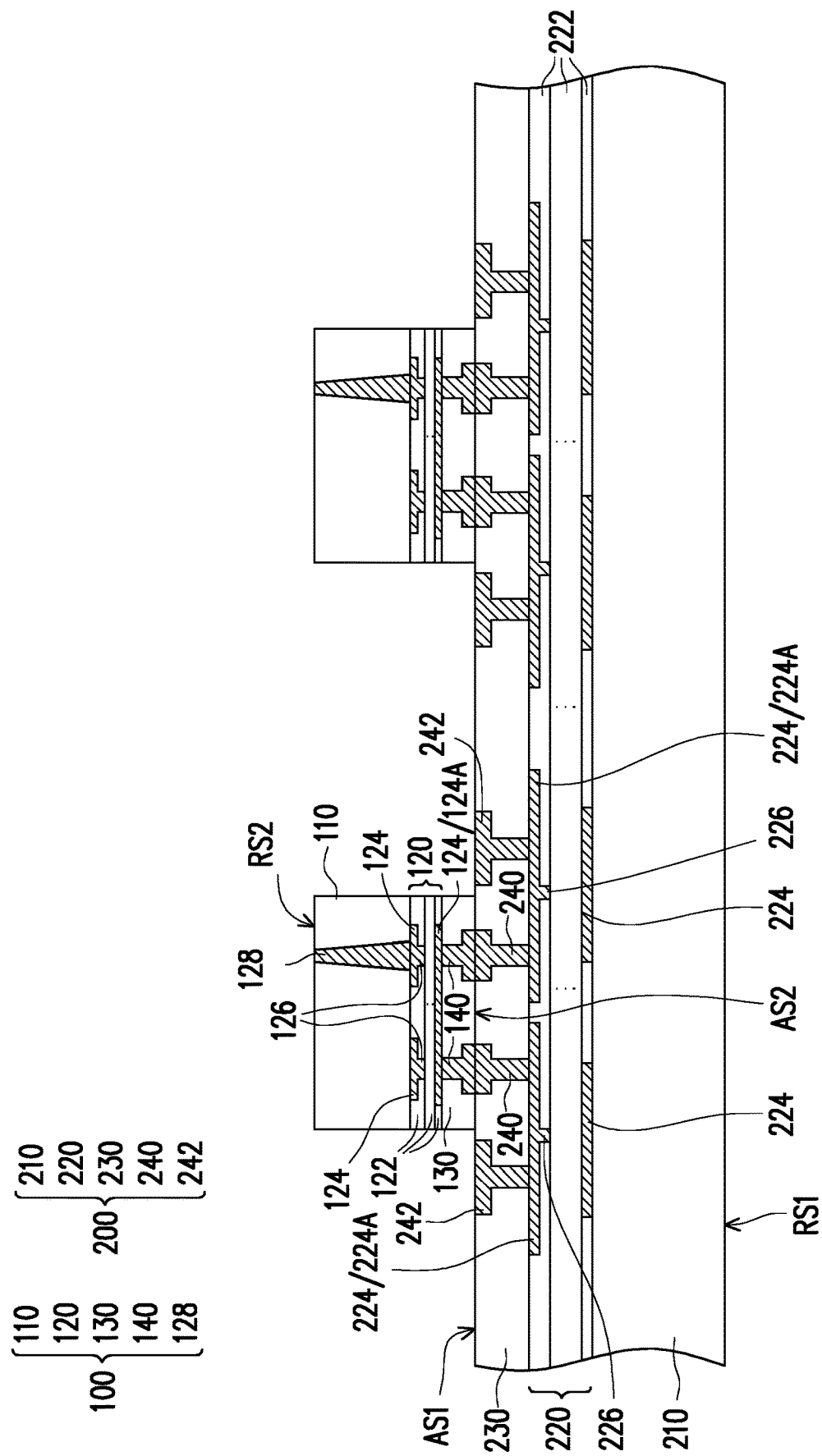
FIG. 1A to FIG. 1H are schematic cross-sectional views illustrating various process steps for a fabricating method of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views illustrating various process steps for a fabricating method of a semiconductor device in accordance with some embodiments of the disclosure. FIG. 2 is schematic top views illustrating the semiconductor device at the stage of FIG. 1D. The schematic cross-sectional views illustrated in FIG. 1A to FIG. 1H are taken along the cross-section line A-A' as shown in FIG. 2.

Figure 2:
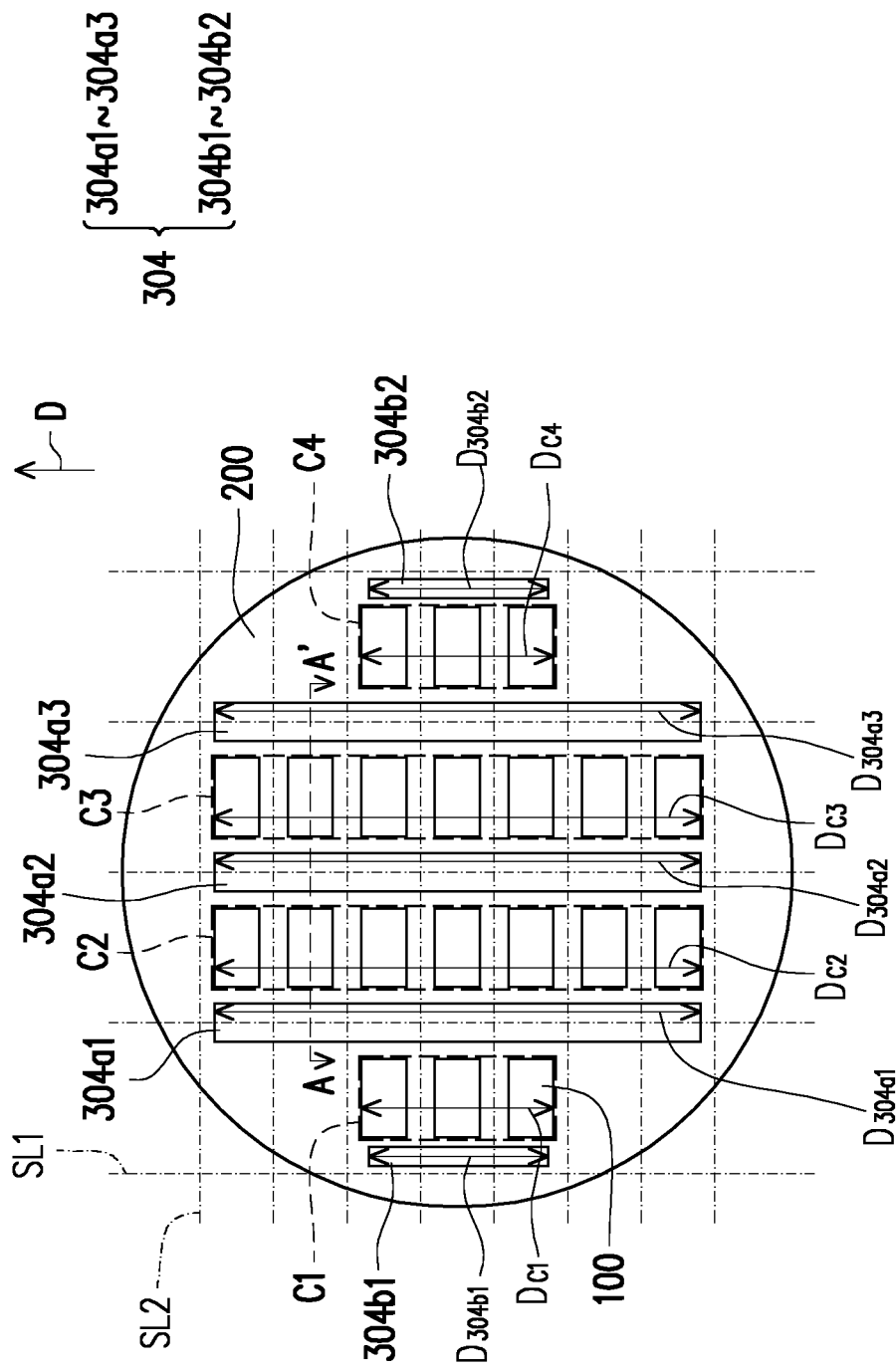
FIG. 2 is a schematic top view illustrating the semiconductor device at the stage of FIG. 1D.

Referring to FIG. 1A, a plurality of semiconductor dies 100 are provided and bonded on a wafer 200. In some embodiments, the wafer 200 may include a plurality of integrated circuit components (not shown) arranged in array. The wafer 200 may include a semiconductor substrate 210 having a plurality of semiconductor devices and a plurality of through semiconductor vias (TSVs) formed therein, an interconnection structure 220 disposed on the semiconductor substrate 210, a dielectric layer 230 covering the interconnection structure 220, a plurality of conductors 240 embedded in the dielectric layer 230 and a plurality of conductors 242 embedded in the dielectric layer 230. The conductors 240 and the conductors 242 are electrically connected to the semiconductor substrate 210 through the interconnection structure 220. As shown in FIG. 1A, the wafer 200 may include an active surface AS1 and a rear surface RS1 opposite to the active surface AS1. In some alternative embodiments, the wafer 200 may be a semiconductor interposer electrically connected to the plurality of semiconductor dies 100.

In some embodiments, the material of the semiconductor substrate 210 may be crystalline silicon, crystalline germanium, crystalline silicon germanium, and/or a III-V compound semiconductor, such as GaAsP, AlInAs, AlGaAs, GaInAs, GaInP, GaInAsP, and the like. In some embodiments, the semiconductor substrate 210 may also be a bulk silicon substrate or a Silicon-On-Insulator (SOI) substrate.

In some embodiments, the interconnection structure 220 may include dielectric layers 222, and conductive wirings 224 and vias 226 formed in dielectric layers 222. In some embodiments, the dielectric layers 222 may be formed of Black Diamond (a registered trademark of Applied Materials), a carbon-containing low-k dielectric material, Hydrogen SilsesQuioxane (HSQ), MethylSilsesQuioxane (MSQ), or the like. In some alternative embodiments, some or all of the dielectric layers 222 are formed of non-low-k dielectric materials, such as silicon oxide, silicon carbide (SiC), silicon carbo-nitride (SiCN), silicon oxy-carbo-nitride (SiOCN), or the like. In some embodiments, the dielectric layers 222 may be formed by suitable fabrication techniques, such as spin-on coating, chemical vapor deposition (CVD), plasma-enhanced chemical vapor deposition (PECVD), or the like.

In some embodiments, the conductive wirings 224 are formed between the dielectric layers 222 and the vias 226 are formed in the dielectric layers 222. The conductive wirings 224 are interconnected through the vias 226. The conductive wirings 224 and the vias 226 may be formed of copper (Cu), copper alloys, or other suitable metallic material. In some embodiments, the conductive wirings 224 include topmost conductive wirings 224A.

In some embodiments, the material of the conductors 240 and 242 may be copper (Cu) or other suitable metallic material, while the material of the dielectric layer 230 may be silicon oxide ($SiO_x$, where x>0), silicon nitride ($SiN_x$, where x>0), silicon oxynitirde ($SiO_xN_y$, where x>0 and y>0), or other suitable dielectric material. The dielectric layer 230 may be formed by depositing a dielectric material layer (not shown) on the interconnection structure 220 and patterning the dielectric material layer to form a plurality of openings in the dielectric material layer. The openings formed in the dielectric layer 230 expose portions of the interconnection structure 220. After the dielectric layer 230 is patterned, a conductive material layer (not shown) may be deposited on the dielectric layer 230 and the portions of the interconnection structure 220 exposed by the openings the dielectric layer 230. Then, a polishing process (e.g., a chemical mechanical polishing process) is performed to partially remove the conductive material layer until the top surface of the dielectric layer 230 is exposed. After performing the polishing process, the conductors 240 and 242 are formed in the openings the dielectric layer 230. As shown in FIG. 1A, the top surface of the dielectric layer 230 and the top surfaces of the conductors 240 and 242 are substantially at the same level so as to provide an appropriate surface for hybrid bonding.

Each one of the semiconductor dies 100 is, for example, a logic die, wherein the logic die may be a Central Processing Unit (CPU) die, a Micro Control Unit (MCU) die, or an Application processor (AP) die. In some embodiments, each one of the semiconductor dies 100 may respectively include a semiconductor substrate 110 having a plurality of semiconductor devices formed therein, an interconnection structure 120 disposed on the semiconductor substrate 110, a dielectric layer 130 covering the interconnection structure 120, and a plurality of conductors 140 embedded in the dielectric layer 130. The conductors 140 are electrically connected to the semiconductor substrate 110 through the interconnection structure 120. As shown in FIG. 1A, each one of the semiconductor dies 100 may respectively include an active surface AS2 and a rear surface RS2 opposite to the active surface AS2.

In some embodiments, the material of the semiconductor substrate 110 may be crystalline silicon, crystalline germanium, crystalline silicon germanium, and/or a III-V compound semiconductor, such as GaAsP, AlInAs, AlGaAs, GaInAs, GaInP, GaInAsP, and the like. In some embodiments, the semiconductor substrate 110 may also be a bulk silicon substrate or a Silicon-On-Insulator (SOI) substrate.

In some embodiments, the interconnection structure 120 may include dielectric layers 122, and conductive wirings 124 and vias 126 formed in dielectric layers 122. In some embodiments, the dielectric layers 122 may be formed of Black Diamond (a registered trademark of Applied Materials), a carbon-containing low-k dielectric material, Hydrogen SilsesQuioxane (HSQ), MethylSilsesQuioxane (MSQ), or the like. In some alternative embodiments, some or all of the dielectric layers 122 are formed of non-low-k dielectric materials, such as silicon oxide, silicon carbide (SiC), silicon carbo-nitride (SiCN), silicon oxy-carbo-nitride (SiOCN), or the like. In some embodiments, the dielectric layers 122 may be formed by suitable fabrication techniques, such as spin-on coating, chemical vapor deposition (CVD), plasma-enhanced chemical vapor deposition (PECVD), or the like.

In some embodiments, the conductive wirings 124 are formed between the dielectric layers 122 and the vias 126 are formed in the dielectric layers 122. The conductive wirings 124 are interconnected through the vias 126. The conductive wirings 124 and the vias 126 may be formed of copper (Cu), copper alloys, or other suitable metallic material. In some embodiments, the conductive wirings 124 include topmost conductive wirings 124A.

In some embodiments, the material of the conductors 140 may be copper (Cu) or other suitable metallic material, while the material of the dielectric layer 130 may be silicon oxide ($SiO_x$, where x>0), silicon nitride ($SiN_x$, where x>0), silicon oxynitirde ($SiO_xN_y$, where x>0 and y>0), or other suitable dielectric material. As shown in FIG. 1A, the top surfaces of the conductors 140 and the top surface of the dielectric layer 130 are substantially at the same level so as to provide an appropriate surface for hybrid bonding.

In some embodiments, each one of the semiconductor dies 100 may respectively further include at least one through semiconductor via (TSV) 128 embedded in the semiconductor substrate 110. In each one of the semiconductor dies 100, the at least one through semiconductor via 128 is electrically connected to the interconnection structure 120 and penetrates through the semiconductor substrate 110. In other words, in each one of the semiconductor dies 100, the at least one through semiconductor via 128 embedded in the semiconductor substrate 110 is exposed at the rear surface RS2.

In some embodiments, the semiconductor dies 100 are hybrid bonded on the wafer 200 through a chip-to-wafer bonding tool. That is, the bonded semiconductor dies 100 and wafer 200 are collectively referred to as a hybrid bonded structure. Herein, the chip-to-wafer bonding tool is a tool utilized to handle such chip scale bonding. In detail, in some embodiments, before bonding the semiconductor dies 100 on the wafer 200, the semiconductor dies 100 may be picked-up and placed onto the active surface AS1 of the wafer 200 such that the active surface AS1 of the wafer 200 is in contact with the active surfaces AS2 of the semiconductor dies 100, and the conductors 140 of the semiconductor dies 100 are substantially aligned and in contact with the conductors 240 of the wafer 200. As shown in FIG. 2 (elaborated hereinafter), the semiconductor dies 100 bonded on the wafer 200 are arranged in a plurality of columns C1~C4. It should be noted that the number of the columns illustrated in FIG. 2 are merely for illustrative purposes, and the disclosure is not limited thereto. In some alternative embodiments, more or less columns of the semiconductor dies 100 may be bonded on the wafer 200 depending on the size of the wafer 200 or the size of the semiconductor dies 100. It should be noted that the number of the semiconductor dies 100 illustrated in FIG. 2 merely serves as an exemplary illustration, and the number of the semiconductor dies 100 may be varied depending on the size of the wafer 200 or the size of the semiconductor dies 100.

In some embodiments, to facilitate the chip-to-wafer hybrid bonding between the semiconductor dies 100 and the wafer 200, surface preparation for bonding surfaces (i.e. the active surface AS1 and the active surfaces AS2) of the wafer 200 and the semiconductor dies 100 may be performed. The surface preparation may include surface cleaning and activation, for example. Surface cleaning may be performed on the active surface AS1 of the wafer 200 and the active surfaces AS2 of the semiconductor dies 100 so as to remove particles on top surfaces of the conductors 140, the dielectric layers 130, the conductors 240 and the dielectric layer 230. The active surface AS1 of the wafer 200 and the active surfaces AS2 of the semiconductor dies 100 may be cleaned by wet cleaning, for example. Not only particles are removed, but also native oxide formed on the top surfaces of the conductors 140 and the conductors 240 may be removed. The native oxide formed on the top surfaces of the conductors 140 and the conductors 240 may be removed by chemicals used in the wet cleaning, for example.

After cleaning the active surface AS1 of the wafer 200 and the active surfaces AS2 of the semiconductor dies 100, activation of the top surfaces of the dielectric layers 130 and the dielectric layer 230 may be performed for development of high bonding strength. In some embodiments, plasma activation may be performed to treat the top surfaces of the dielectric layers 130 and 230.

When the activated top surfaces of the dielectric layers 130 are in contact with the activated top surface of the dielectric layer 230, the dielectric layer 230 of the wafer 200 and the dielectric layers 130 of the semiconductor dies 100 are pre-bonded. In other words, the wafer 200 and the semiconductor dies 100 are pre-bonded through the pre-bonding of the dielectric layers 130 and the dielectric layer 230. After the dielectric layers 130 and the dielectric layer 230 are pre-bonded, the conductors 140 are in contact with and electrically connected to the conductors 240.

After pre-bonding the semiconductor dies 100 onto the wafer 200, hybrid bonding of the semiconductor dies 100 and the wafer 200 is performed. The hybrid bonding of the semiconductor dies 100 and the wafer 200 may include a treatment for dielectric bonding and a thermal annealing for conductor bonding. In some embodiments, the treatment for dielectric bonding is performed to strengthen the bonding between the dielectric layers 130 and the dielectric layer 230. For example, the treatment for dielectric bonding may be performed at temperature ranging from about 100 Celsius degree to about 150 Celsius degree. After performing the treatment for dielectric bonding, the thermal annealing for conductor bonding is performed to facilitate the bonding between the conductors 140 and the conductors 240. For example, the thermal annealing for conductor bonding may be performed at temperature ranging from about 300 Celsius degree to about 400 Celsius degree. The process temperature of the thermal annealing for conductor bonding is higher than that of the treatment for dielectric bonding. After performing the thermal annealing for conductor bonding, the dielectric layers 130 are bonded to the dielectric layer 230 and the conductors 140 are bonded to the conductors 240. In some embodiments, the conductors 140 may be conductive vias (e.g., copper vias), conductive pads (e.g., copper pads) or the combinations thereof while the conductors 240 may be conductive vias (e.g., copper vias), conductive pads (e.g., copper pads) or the combinations thereof. For example, the conductor bonding between the conductors 140 and the conductors 240 may be via-to-via bonding, pad-to-pad bonding or via-to-pad bonding.

After performing the hybrid bonding of the semiconductor dies 100 and the wafer 200, the interconnection structures 120 of the semiconductor dies 100 and the interconnection structure 220 of the wafer 200 are electrically connected to each other through the conductors 140 and the conductors 240.

Figure 1B:
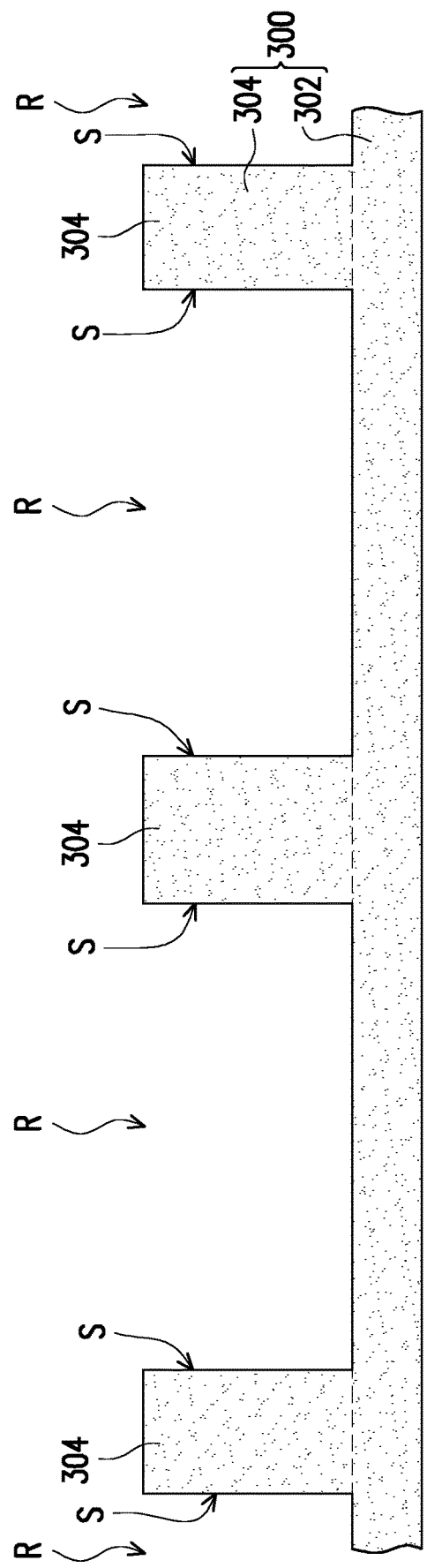

Referring to FIG. 1B, a wafer 300 is provided. In some embodiments, the wafer 300 includes a base portion 302 and at least one dummy portion 304 protruding from the base portion 302. As shown in FIG. 1B, three dummy portions 304 are formed on the base portion 302, and the wafer 300 may further include a plurality of recesses R between the dummy portions 304. In some embodiments, the wafer 300 may be formed by the following steps. First, a semiconductor substrate (not shown) is provided. In some embodiments, the semiconductor substrate may be a silicon substrate. Thereafter, portions of the semiconductor substrate are partially removed through an etching process, for example, to render the recesses R and the at least one dummy portion 304. In some embodiments, the etching process may be a wet etching process. However, the disclosure is not limited thereto. In some alternative embodiments, the etching process may be a dry etching process. In some embodiments, the roughness of the sidewalls S of the recesses R (i.e. the side surfaces of the at least one dummy portion 304) ranges between about 0.1 μm and about 0.5 μm. That is, performing the etching process may render a smooth sidewall profile.

Figure 1C:
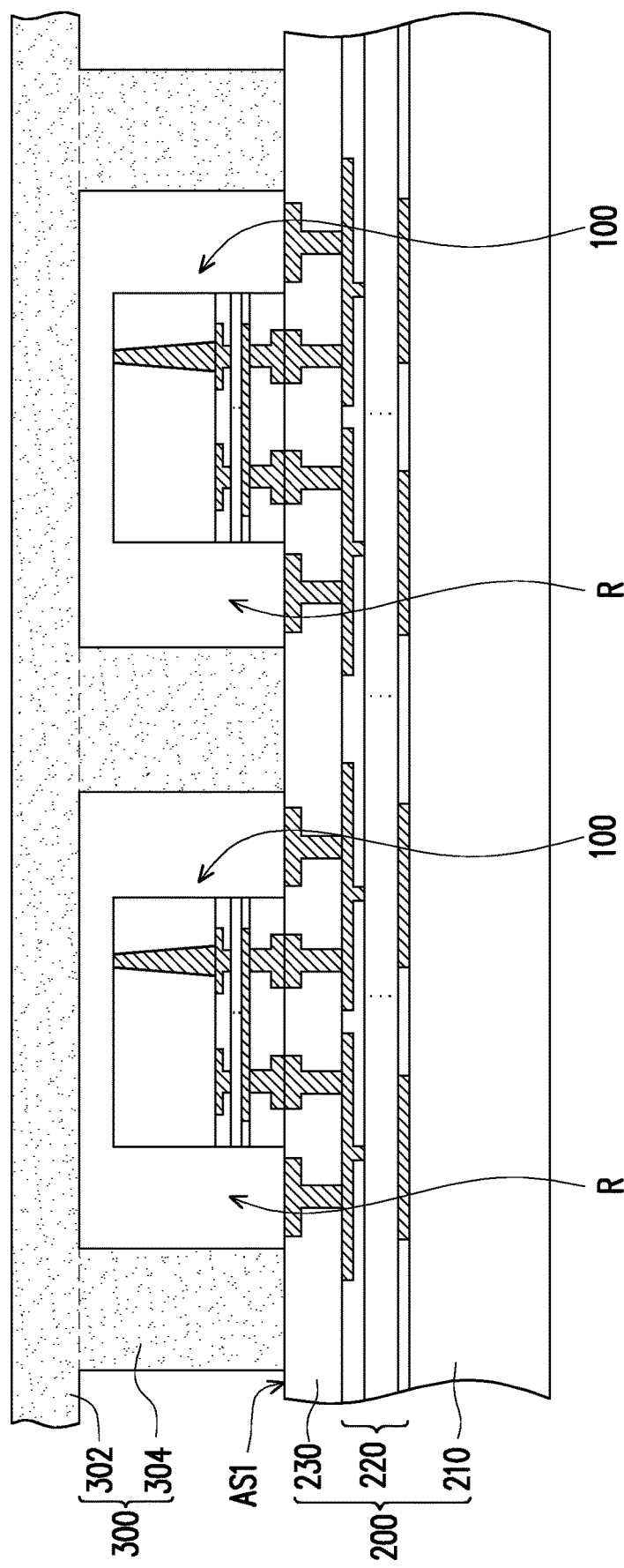

Referring to FIG. 1C, the wafer 300 is flipped and the at least one dummy portion 304 of the wafer 300 is bonded to the wafer 200. In some embodiments, the at least one dummy portion 304 of the wafer 300 is bonded to the wafer 200 through a wafer-to-wafer bonding tool. Herein, the wafer-to-wafer bonding tool is a tool utilized to handle a wafer scale bonding. In detail, in some embodiments, before bonding the at least one dummy portion 304 of the wafer 300 on the wafer 200, the wafer 300 may be picked-up and placed onto the active surface AS1 of the wafer 200 such that the dielectric layer 230 of the wafer 200 is in contact with the at least one dummy portion 304 of the wafer 300, and the semiconductor dies 100 are accommodated in the recesses R. As shown in FIG. 1C, the semiconductor dies 100 are covered by the base portion 302 of the wafer 300 while the semiconductor dies 100 are accommodated in the recesses R. In other words, the wafer 300 may be referred to as a cover lid. In some embodiments, the at least one dummy portion 304 of the wafer 300 is bonded to the dielectric layer 230 of the wafer 200 through fusion bonding process.

Figure 1D:
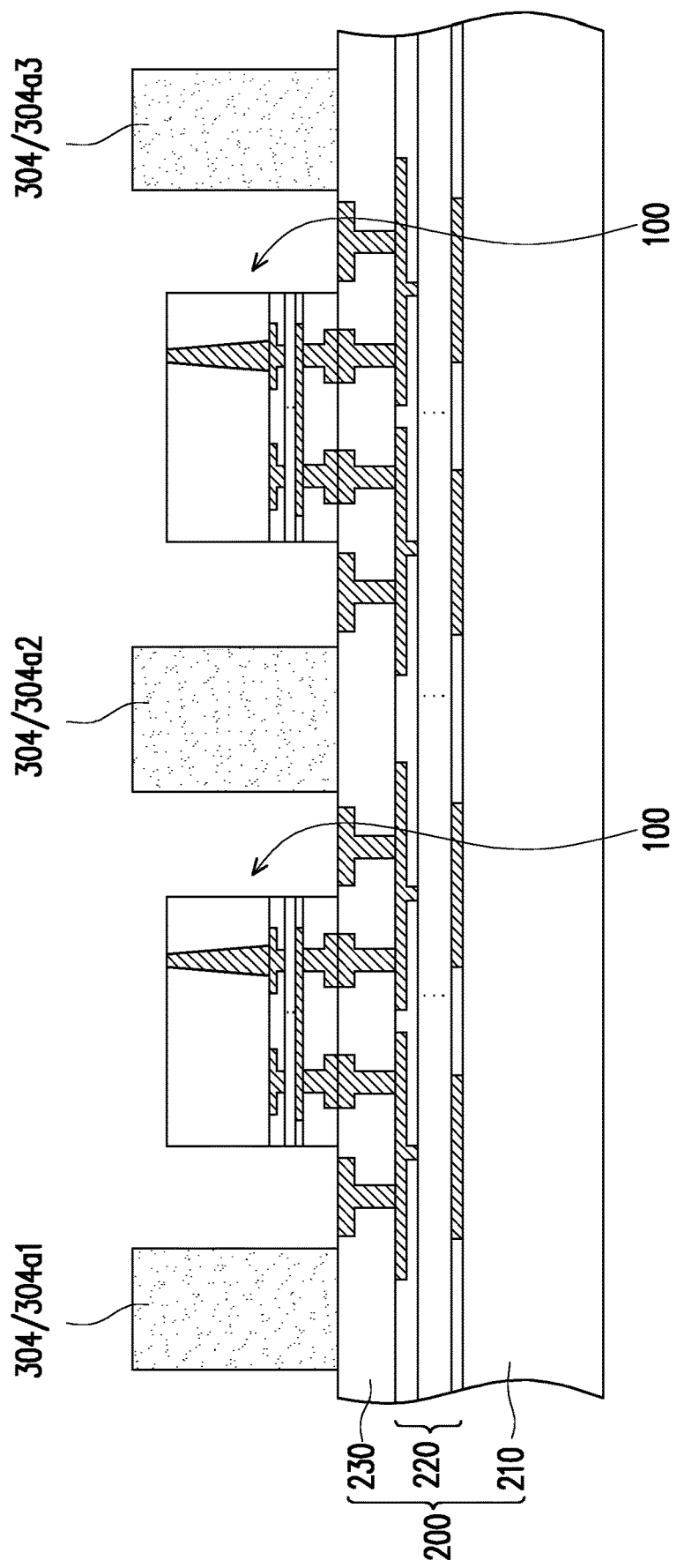

Referring to FIG. 1C and FIG. 1D, the base portion 302 is removed until the at least one dummy portion 304 and the semiconductor dies 100 are exposed. For example, the base portion 302 may be grinded until the at least one dummy portion 304 and the semiconductor dies 100 are exposed. In some embodiments, the base portion 302 is removed by a chemical mechanical polishing (CMP) process. As shown in FIG. 1C and FIG. 1D, the base portion 302 is removed and the at least one dummy portion 304 remains on the wafer 200. In other alternative embodiments, while the base portion 302 is removed until the semiconductor dies 100 are exposed, a portion of the at least one dummy portion 304 may be slightly removed as well.

Referring to FIG. 1D and FIG. 2, the at least one dummy portion 304 may include a first dummy portion 304a1, a first dummy portion 304a2, a first dummy portion 304a3, a second dummy portion 304b1 and a second dummy portion 304b2 on the wafer 200. In some embodiments, the first dummy portion 304a1 is disposed between the column C1 and the column C2, the first dummy portion 304a2 is disposed between the column C2 and the column C3, and the first dummy portion 304a3 is disposed between the column C3 and the column C2. In other words, in some embodiments, each first dummy portion (i.e. the first dummy portion 304a1, the first dummy portion 304a2, or the first dummy portion 304a3) is disposed between two adjacent columns among the columns C1~C4.

In some embodiments, the first dummy portions 304a1~304a3 may be first dummy strips 304a1~304a3 extending along an extending direction D which is substantially parallel to the columns C1~C4. In some embodiments, as shown in FIG. 2, the dimension $D_{304a1}$ of the first dummy strip 304a1, the dimension $D_{304a2}$ of the first dummy strip 304a2 and the dimension $D_{304a3}$ of the first dummy strip 304a3 in the extending direction D are substantially equal to the dimension $D_{C2}$ of the column C2 or the dimension $D_{C3}$ of the column C3 in the extending direction D. That is, the dimension of each one of the first dummy strips in the extending direction D may be substantially equal to the dimension of one column among the columns C1~C4 in the extending direction D. However, the disclosure is not limited thereto. In some alternative embodiments, at least one of the dimension $D_{304a1}$ of the first dummy strip 304a1, the dimension $D_{304a2}$ of the first dummy strip 304a2 and the dimension $D_{304a3}$ of the first dummy strip 304a3 in the extending direction D may be different from the dimension $D_{C2}$ of the column C2 or the dimension $D_{C3}$ of the column C3 in the extending direction D. In some embodiments, as shown in FIG. 2, the dimension $D_{304a2}$ of the first dummy strip 304a2 and the dimension $D_{304a3}$ of the first dummy strip 304a3 in the extending direction D are greater than the dimension $D_{C1}$ of the column C1 or the dimension $D_{C4}$ of the column C4 in the extending direction D. That is, the dimension of each one of the first dummy strips in the extending direction D may be greater than the dimension of one column among the columns C1~C4 in the extending direction D.

In some embodiments, the wafer 200 has a plurality of scribe lines SL1 and a plurality of scribe lines SL2. In some embodiments, the scribe lines SL1 are substantially parallel to the extending direction D, and the scribe lines SL2 are substantially perpendicular to the extending direction D. That is, each one of the scribe lines SL1 is substantially perpendicular to each one of the scribe lines SL2. In some embodiments, the first dummy strips 304a1~304a3 extend substantially parallel to the scribe lines SL1. However, the disclosure is not limited thereto. In some alternative embodiments, the first dummy strips 304a1~304a3 may extend substantially parallel to the scribe lines SL2. In some embodiments, each one of the first dummy portions 304a1~304a3 overlaps with one of the scribe lines SL1 respectively. However, the disclosure is not limited thereto. In some alternative embodiments, not shown in FIG. 2, the first dummy portions 304a1~304a3 may not overlap with the scribe lines SL1.

In some embodiments, the second dummy portion 304b1~304b2 are disposed aside of the first dummy portions 304a1~304a3. In detail, the column C1 is between the first dummy portions 304a1~304a3 and the second dummy portion 304b1, and the column C4 is between the first dummy portions 304a1~304a3 and the second dummy portion 304b2. That is, in some embodiments, the outermost column C1 or C4 among the columns C1~C4 is between the first dummy portions 304a1~304a3 and one of the second dummy portions 304b1~304b2.

In some embodiments, the second dummy portions 304b1~304b2 may be second dummy strips 304b1~304b2 extending along the extending direction D. In some embodiments, as shown in FIG. 2, the dimension $D_{304b1}$ of the second dummy portions 304b1 and the dimension $D_{304b2}$ of the second dummy portions 304b2 in the extending direction D are smaller than the dimension $D_{C1}$~$D_{C4}$ of the columns C1~C4 in the extending direction D. However, the disclosure is not limited thereto. In some alternative embodiments, the dimension $D_{304b1}$ of the second dummy portions 304b1 and the dimension $D_{304b2}$ of the second dummy portions 304b2 in the extending direction D may be substantially equal to the dimension $D_{C1}$ of the column C1 or the dimension $D_{C4}$ of the column C4 (i.e. the outermost column among the columns C1~C4) in the extending direction D, while smaller than the dimension $D_{c2}$ of the column C2 or the dimension $D_{c3}$ of the column C3 in the extending direction D. In some embodiments, the second dummy portions 304b1~304b2 extend substantially parallel to the scribe lines SL1. However, the disclosure is not limited thereto. In some alternative embodiments, the second dummy portions 304b1~304b2 may extend substantially parallel to the scribe lines SL2. In some embodiments, the second dummy portions 304b1~304b2 do not overlap with the scribe lines SL1. However, the disclosure is not limited thereto. In some alternative embodiments, not shown in FIG. 2, the second dummy portions 304b1~304b2 may overlap with one of the scribe lines SL1.

As mentioned above, since the first dummy portions 304a1~304a3 and the second dummy portion 304b1~304b2 bonded on the wafer 200 are formed by wafer level bonding (i.e. wafer-to-wafer bonding) process followed by removal of the base portion 302, it is easy and efficient to fabricate the first dummy portions 304a1~304a3 and the second dummy portion 304b1~304b2 on the wafer 200. Accordingly, the fabricating method of the semiconductor device 10 saves more time and the process controllability of the fabricating method of the semiconductor device 10 is enhanced.

Figure 1E:
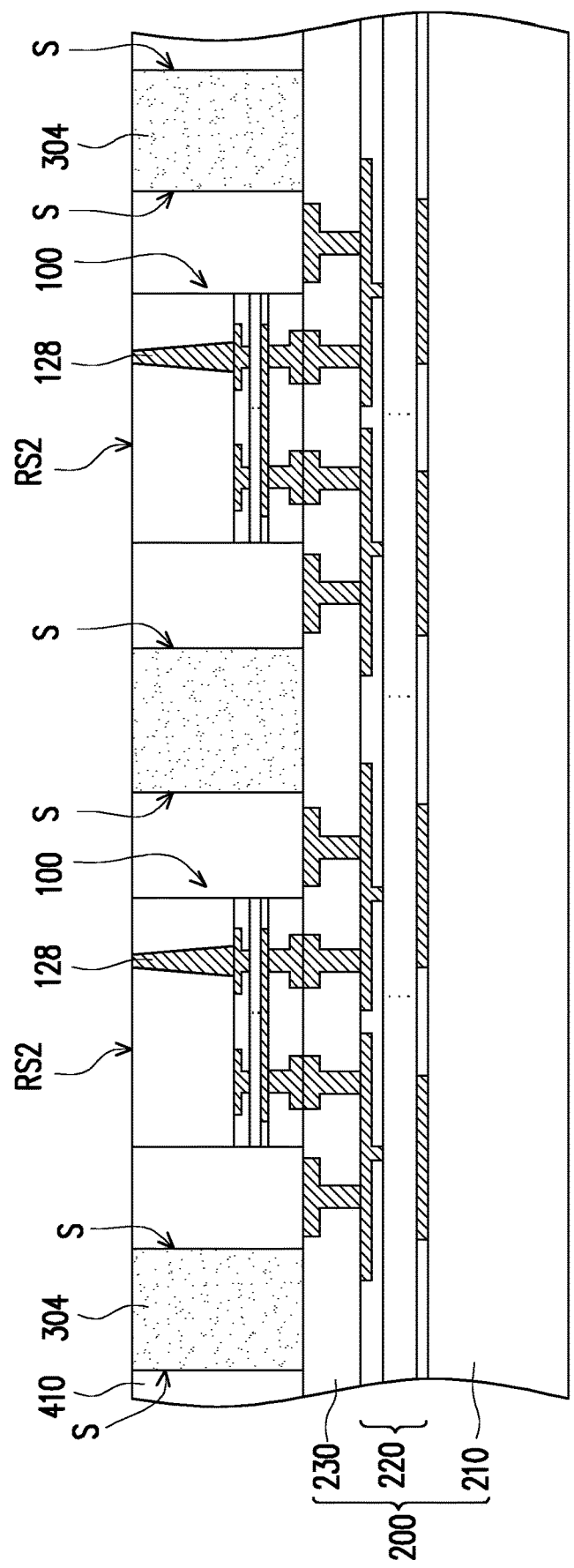

Referring to FIG. 1E, a dielectric layer 410 is formed to laterally encapsulate the semiconductor dies 100 and the at least one dummy portion 304. The dielectric layer 410 may physically contact the side surfaces of the semiconductor dies 100 and the side surfaces of the at least one dummy portion 304 (i.e. the sidewalls S of the recesses R). In detail, although FIG. 1E does not illustrate, the dielectric layer 410 may laterally encapsulate the semiconductor dies 100, the first dummy portions 304a1~304a3, and the second dummy portions 304b1~304b2 (shown in FIG. 2). In some embodiments, the dielectric layer 410 may be formed by the following steps. First, a dielectric material layer (not shown) may be formed over the wafer 200 to cover the semiconductor dies 100 and the at least one dummy portion 304 (e.g., the first dummy portions 304a1~304a3 and the second dummy portions 304b1~304b2), wherein the maximum thickness of the dielectric material layer may be greater than the thickness of the semiconductor dies 100 and the thickness of the at least one dummy portion 304. In some embodiments, the dielectric material layer may be formed by chemical vapor deposition (CVD), plasma-enhanced chemical vapor deposition (PECVD), or other suitable deposition processes. In some embodiment, the dielectric material layer may be a single-layered structure and the material of the dielectric material layer may include silicon oxide, silicon nitride, and/or tetraethoxysilane (TEOS). However, the disclosure is not limited thereto. In some alternative embodiments, the dielectric material layer may be a multi-layered structure and include a plurality of stacked layers. Thereafter, a grinding or polishing process is performed on the dielectric material layer so as to partially remove the dielectric material layer until the through semiconductor vias 128 and the rear surfaces RS2 of the semiconductor dies 100 are exposed to render the dielectric layer 410. In some embodiments, the dielectric material layer may be partially removed by a chemical mechanical polishing (CMP) process, a mechanical grinding process, the combination thereof or other suitable removal processes.

Figure 1F:
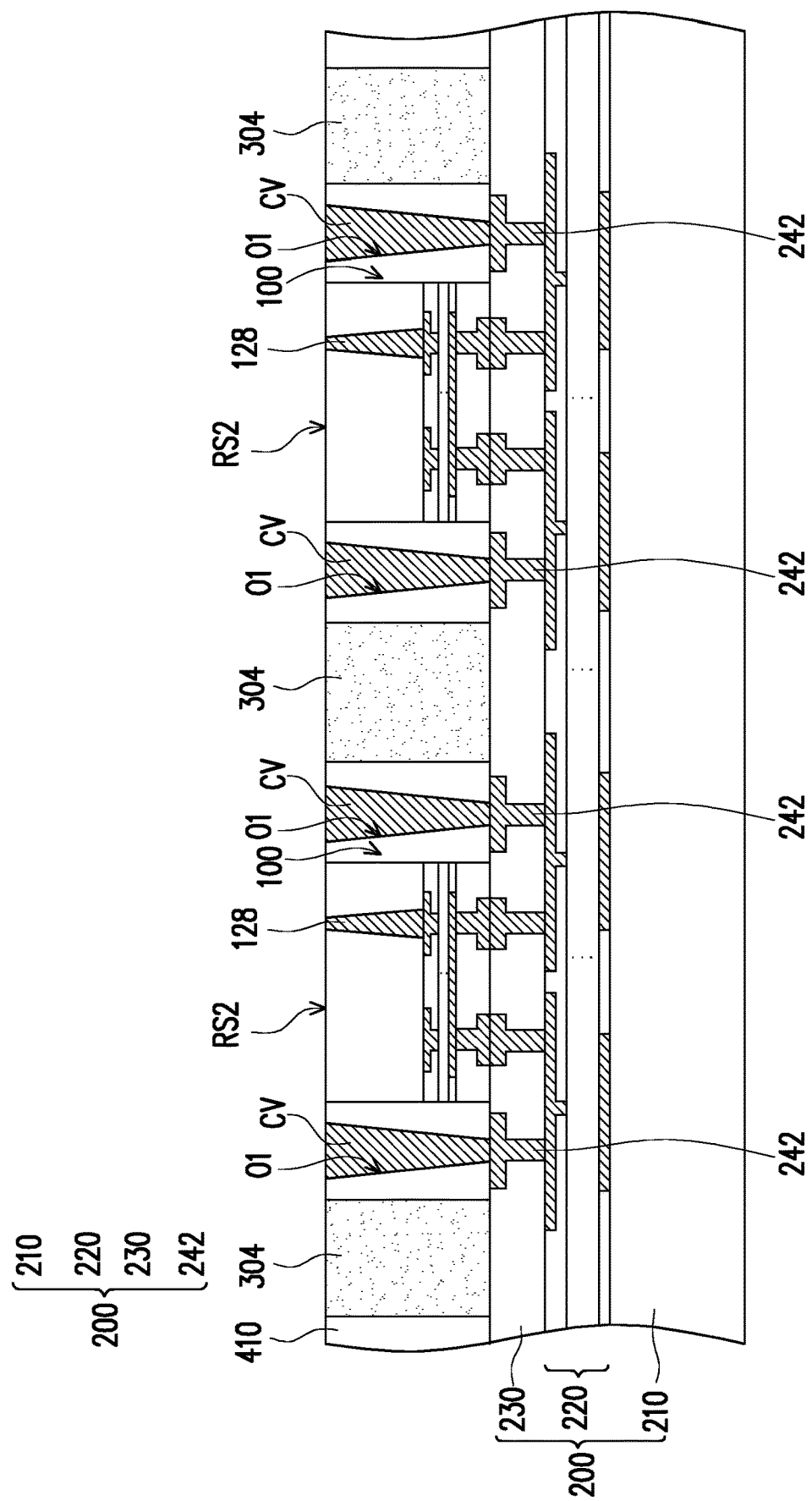

Referring to FIG. 1F, conductive vias CV are formed in the dielectric layer 410. The conductive vias CV penetrate through the dielectric layer 410 and are electrically connected to the conductors 242. For example, the conductive vias CV may physically contact to the conductors 242. In some embodiments, the conductive vias CV are electrically connected to the conductors 242. In some embodiments, the conductive vias CV may be formed by the following steps. First, a photoresist layer (not shown) is formed over the dielectric layer 410. In some embodiments, the photoresist layer may be formed through spin-coating or other suitable methods. Thereafter, the photoresist layer is patterned to form a patterned photoresist layer, and the dielectric layer 410 is patterned using the patterned photoresist layer as a mask so as to form a plurality of openings O1 extending down to the conductors 242. The patterned photoresist layer is then removed or stripped. After the patterned photoresist layer is removed or stripped, a conductive material (not shown) is formed on the dielectric layer 410 and is filled into the openings O1. In some embodiments, the patterned photoresist layer may be removed or stripped through, for example, etching, ashing, or other suitable removal processes. In some embodiments, the conductive material may be formed by a plating process, a deposition process or other suitable processes. The plating process is, for example, electro-plating, electroless-plating, immersion plating, or the like. In some embodiments, the conductive material includes, for example, copper, copper alloys, or the like. A planarization process such as a chemical mechanical polishing (CMP) process may be performed to remove excess portions of the conductive material out of the openings O1 so as to form the conductive vias CV within the openings O1 of the dielectric layer 410.

In some embodiments, as shown in FIG. 1F, the conductive vias CV have a tapered profile, with top widths slightly greater than the respective bottom widths. However, the disclosure is not limited thereto. In some alternative embodiments, the conductive vias CV may have substantially straight and vertical sidewalls along a direction which is substantially perpendicular to the rear surfaces RS2 of the semiconductor dies 100. It should be noted that the number of the conductive vias CV illustrated in FIG. 1F merely serves as an exemplary illustration, and the number of the conductive vias CV may vary depending on the circuit design.

Figure 1G:
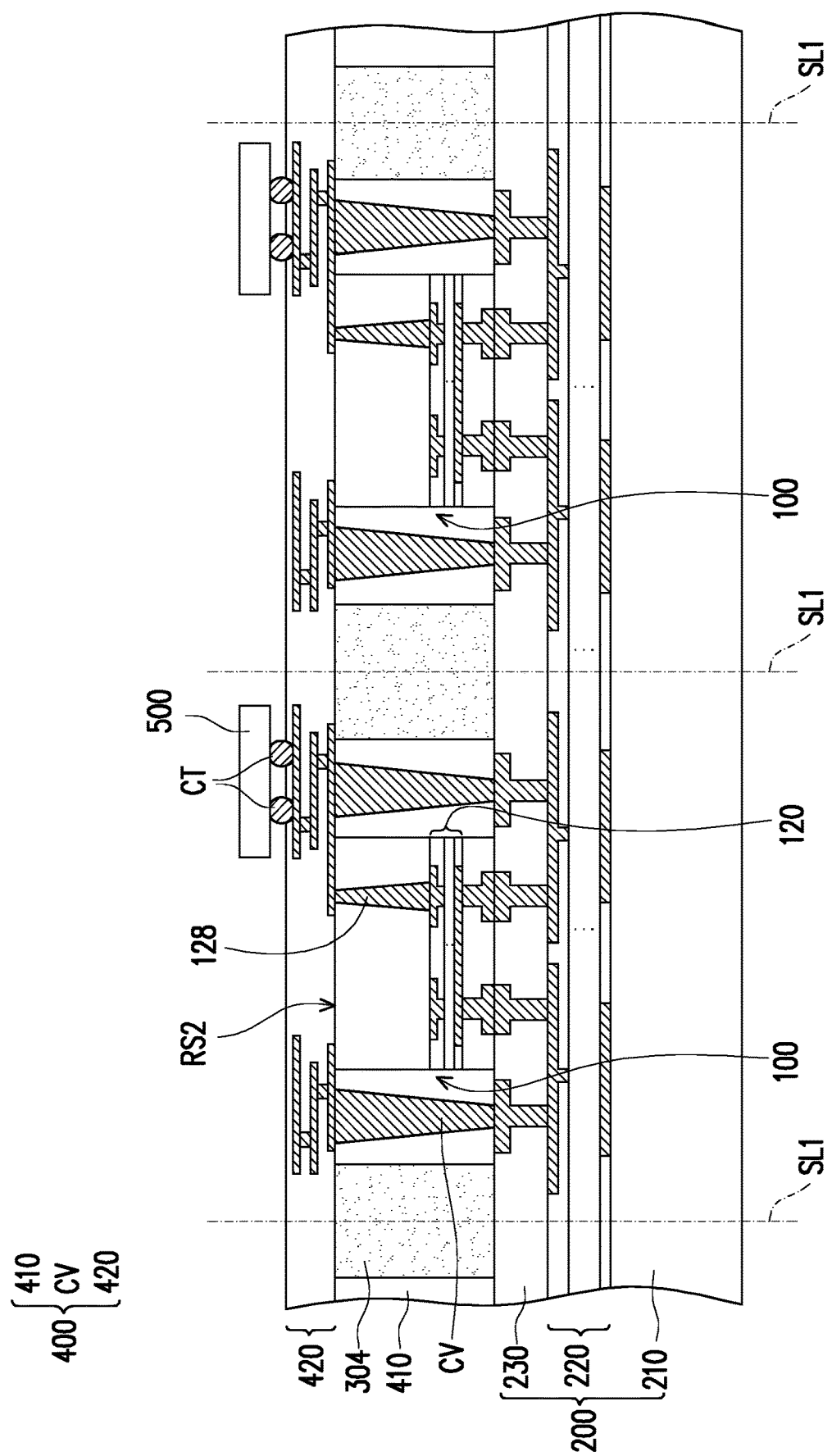

Referring to FIG. 1G, a redistribution circuit layer 420 is formed over the dielectric layer 410, the semiconductor dies 100, the at least one dummy portion 304, and the conductive vias CV to form a redistribution structure 400. The redistribution circuit layer 420 may be electrically connected to and physically contact the through semiconductor vias 128 of the semiconductor dies 100 and the conductive vias CV. Furthermore, the redistribution circuit layer 420 may be electrically connected to the interconnection structures 120 through the through semiconductor vias 128, and the redistribution circuit layer 420 may be electrically connected to the interconnection structures 220 through the conductive vias CV and the conductors 242. As shown in FIG. 1G, in some embodiments, the redistribution circuit layer 420 may include redistribution wirings and inter-dielectric layers stacked alternately.

The redistribution structure 400 includes the dielectric layer 410, the conductive vias CV, and the redistribution circuit layer 420. The dielectric layer 410 laterally encapsulates the semiconductor dies 100 and the at least one dummy portion 304. The conductive vias CV are embedded in the dielectric layer 410 and penetrate through the dielectric layer 410. The redistribution circuit layer 420 is connected to the semiconductor dies 100 and the conductive vias CV.

As shown in FIG. 1G, a plurality of semiconductor dies 500 is provided. Each one of the semiconductor dies 500 is, for example, a logic die or a memory die, wherein the logic die may be an input-output (JO) die, or an Application processor (AP) die, the memory die may be a Dynamic Random Access Memory (DRAM) die or a Static Random Access Memory (SRAM) die. The semiconductor dies 500 are electrically connected to the redistribution circuit layer 420 through the conductive terminals CT.

Figure 1H:
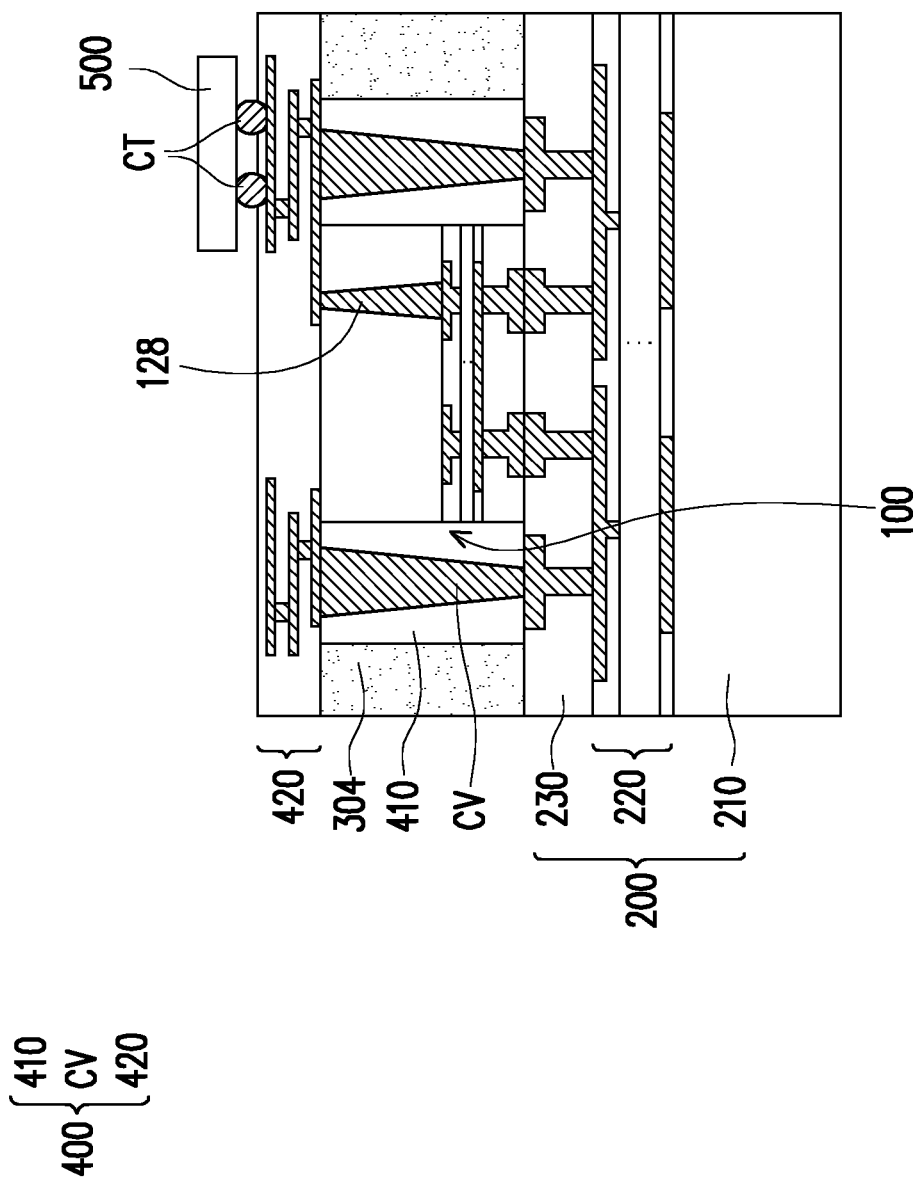

Referring to FIG. 1G, FIG. 1H and FIG. 2, the structure illustrated in FIG. 1G is diced or singulated along the scribe lines SL1 and along the scribe lines SL2 to form a plurality of semiconductor devices 10. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, the semiconductor devices 10 may be further mounted onto a package substrate (not shown), and the package substrate may be a printed circuit board.

It should be noted that in the semiconductor devices 10, each one of the semiconductor dies 100 has at least one through semiconductor via 128 electrically connected to the redistribution structure 400, and the redistribution structure 400 includes the conductive vias CV penetrating through the dielectric layer 410 and electrically connected to the wafer 200, but the disclosure is not limited thereto. In some alternative embodiments, the redistribution structure 400 may not include conductive vias penetrating through the dielectric layer 410. In other alternative embodiments, the semiconductor dies 100 may not include any through semiconductor via.

Figure 3:
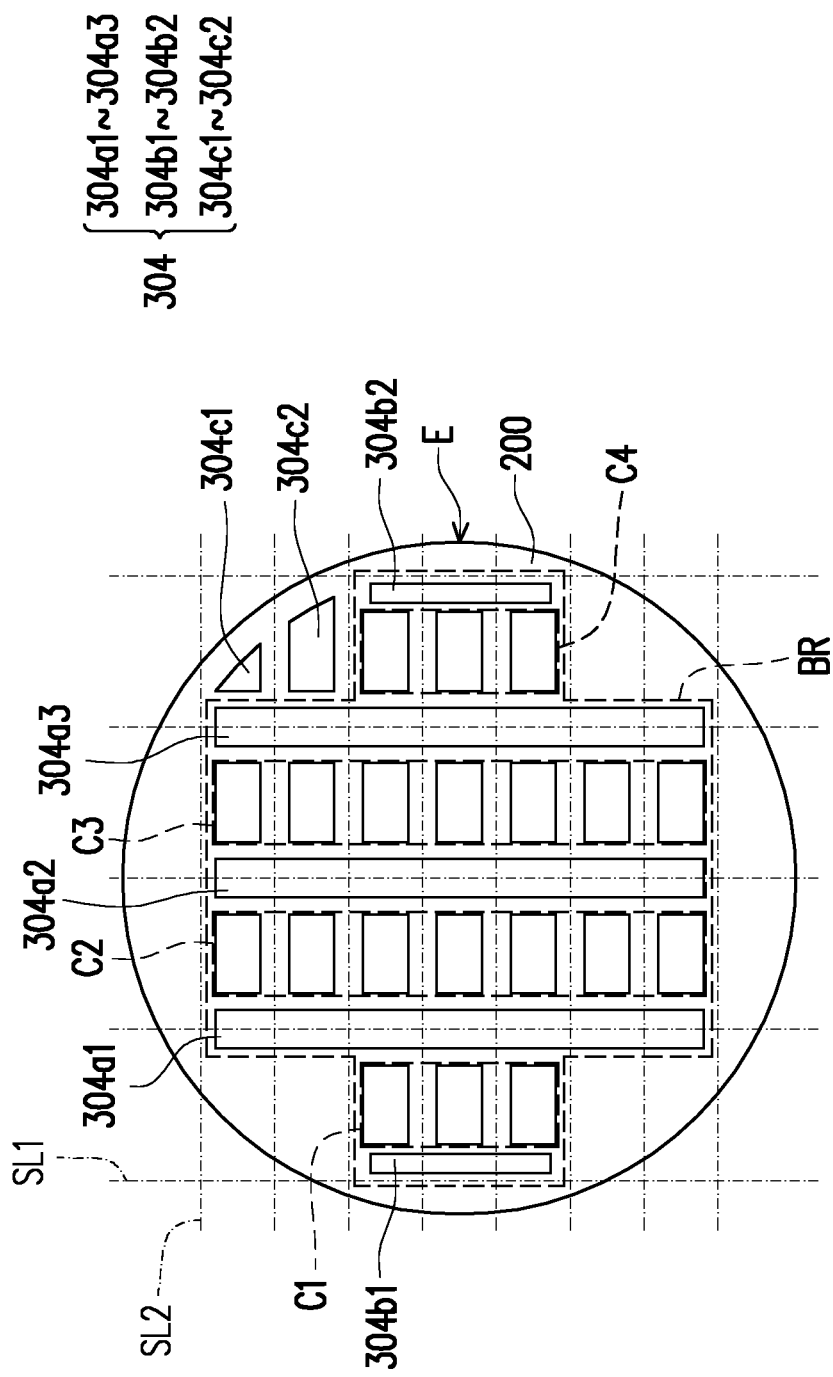
FIG. 3 is a schematic top view illustrating a semiconductor device at a stage in a fabricating method accordance with some alternative embodiments of the disclosure.

FIG. 3 is a schematic top view illustrating a semiconductor device at a stage in a fabricating method accordance with some alternative embodiments of the disclosure.

Referring to FIG. 2 and FIG. 3, the at least one dummy portion 304 illustrated in FIG. 3 is similar with the at least one dummy portion 304 illustrated in FIG. 2 except that the at least one dummy portion 304 of FIG. 3 further includes a third dummy portion 304c1 and a third dummy portion 304c2 on the wafer 200. In some embodiments, the third dummy portion 304c1 and the third dummy portion 304c2 are disposed between an edge E of first wafer 200 and a die bonding area BA where the semiconductor dies 100 are distributed. That is, the third dummy portion 304c1 and the third dummy portion 304c2 occupy part area of the wafer 200 out of the die bonding area BA. As such, the subsequently formed semiconductor devices form the structure illustrated in FIG. 3 may have enhanced reliability. In some embodiments, the first dummy portions 304a1~304a3 and the second dummy portion 304b1~304b2 are also distributed in the die bonding area BA. In some embodiments, the third dummy portions 304c1~304c2 are separated from the first dummy portions 304a1~304a3, and the third dummy portions 304c1~304c2 are separated from the second dummy portion 304b1~304b2.

As shown in FIG. 3, the contours of the third dummy portions 304c1~304c2 are collectively configured to substantially meet the contour of the area which is surrounded by the first dummy portion 304a3, the column C4, the second dummy portion 304b2 and the edge E of the wafer 200. In view of this, although two third dummy portions 304c1~304c2 are illustrated in FIG. 3, the disclosure is not limited thereto. In some alternative embodiments, the third dummy portions 304c1~304c2 may be connected with each other to form an integrated dummy portion, and the contour of said integrated dummy portion may be similar to the contour of the area which is surrounded by the first dummy portion 304a3, the column C4, the second dummy portion 304b2 and the edge E of the wafer 200. That is, the number of the third dummy portions 304c1~304c2 illustrated in FIG. 3 merely serves as an exemplary illustration, and the number of the third dummy portions 304c1~304c2 may vary based on demand.

Figure 4:
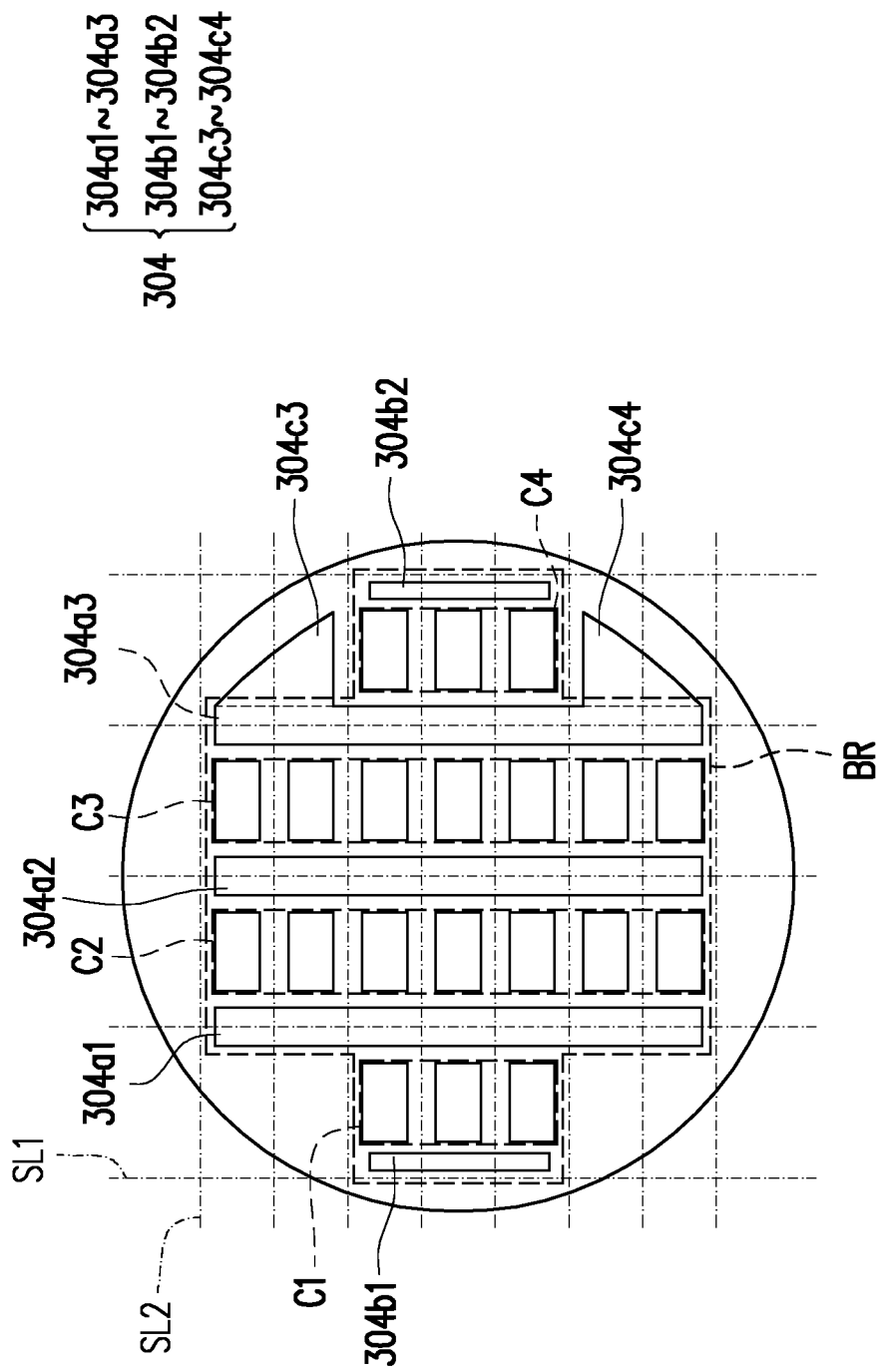
FIG. 4 is a schematic top view illustrating a semiconductor device at a stage in a fabricating method accordance with some alternative embodiments of the disclosure.

FIG. 4 is a schematic top view illustrating a semiconductor device at a stage in a fabricating method accordance with some alternative embodiments of the disclosure.

Referring to FIG. 3 and FIG. 4, the at least one dummy portion 304 illustrated in FIG. 4 is similar with the at least one dummy portion 304 illustrated in FIG. 3 except that the arrangement of the third dummy portions included in the at least one dummy portion 304. As such, the third dummy portions 304c3~304c4 illustrated in FIG. 4 may be similar to the third dummy portions 304c1~304c2 illustrated in FIG. 3, and the difference between the third dummy portions 304c3~304c4 and the third dummy portions 304c1~304c2 is illustrated in details below, and the similar detailed descriptions are not iterated herein. Referring to FIG. 3 and FIG. 4, the third dummy portions 304c3~304c4 illustrated in FIG. 4 are connected with the first dummy portion 304a1, while the third dummy portions 304c1~304c2 illustrated in FIG. 3 are separated from the first dummy portion 304a1. That is, the third dummy portions 304c3~304c4 illustrated in FIG. 4 may extend into the die bonding area BA to connect with the first dummy portion 304a1.

Figure 5:
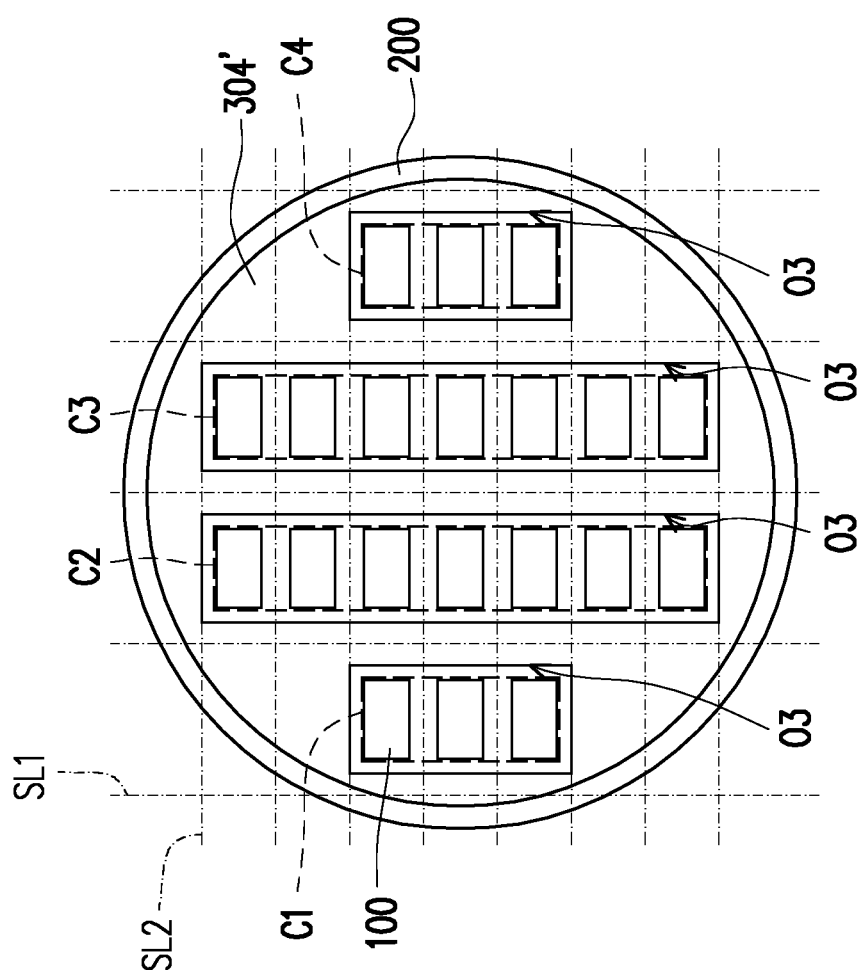
FIG. 5 is a schematic top view illustrating a semiconductor device at a stage in a fabricating method accordance with some alternative embodiments of the disclosure.

FIG. 5 is a schematic top view illustrating a semiconductor device at a stage in a fabricating method accordance with some alternative embodiments of the disclosure.

Referring to FIG. 2 and FIG. 5, at least one dummy portion 304' illustrated in FIG. 5 is similar with the at least one dummy portion 304 illustrated in FIG. 2, so the difference between the at least one dummy portion 304' and the at least one dummy portion 304 is illustrated in details below, and the similar detailed descriptions are not iterated herein.

Referring to FIG. 5, the at least one dummy portion 304' is a dummy frame having a plurality of openings O3 exposing the semiconductor dies 100. That is, in some embodiments, the at least one dummy portion 304' may be in bulk form.

In the embodiments of FIG. 1A to FIG. 1H, in each one of the semiconductor dies 100, the at least one through semiconductor via 128 penetrates through the semiconductor substrate 110. However, the disclosure is not limited thereto. In some alternative embodiments, the at least one through semiconductor via 128 may not penetrate through the semiconductor substrate 110. The details will be described below with reference to FIG. 6A to FIG. 6D.

FIG. 6A to FIG. 6D are schematic cross-sectional views illustrating some process steps for a fabricating method of a semiconductor device in accordance with some alternative embodiments of the disclosure. It should be noted that the reference numerals and a part of the contents in the previous embodiments are used in the following embodiments, in which identical or similar reference numerals indicate identical or similar elements, and repeated description of the same technical contents is omitted. The omitted part of the description can refer to the foregoing embodiments, which is not repeated in the following embodiments.

Figure 6A:
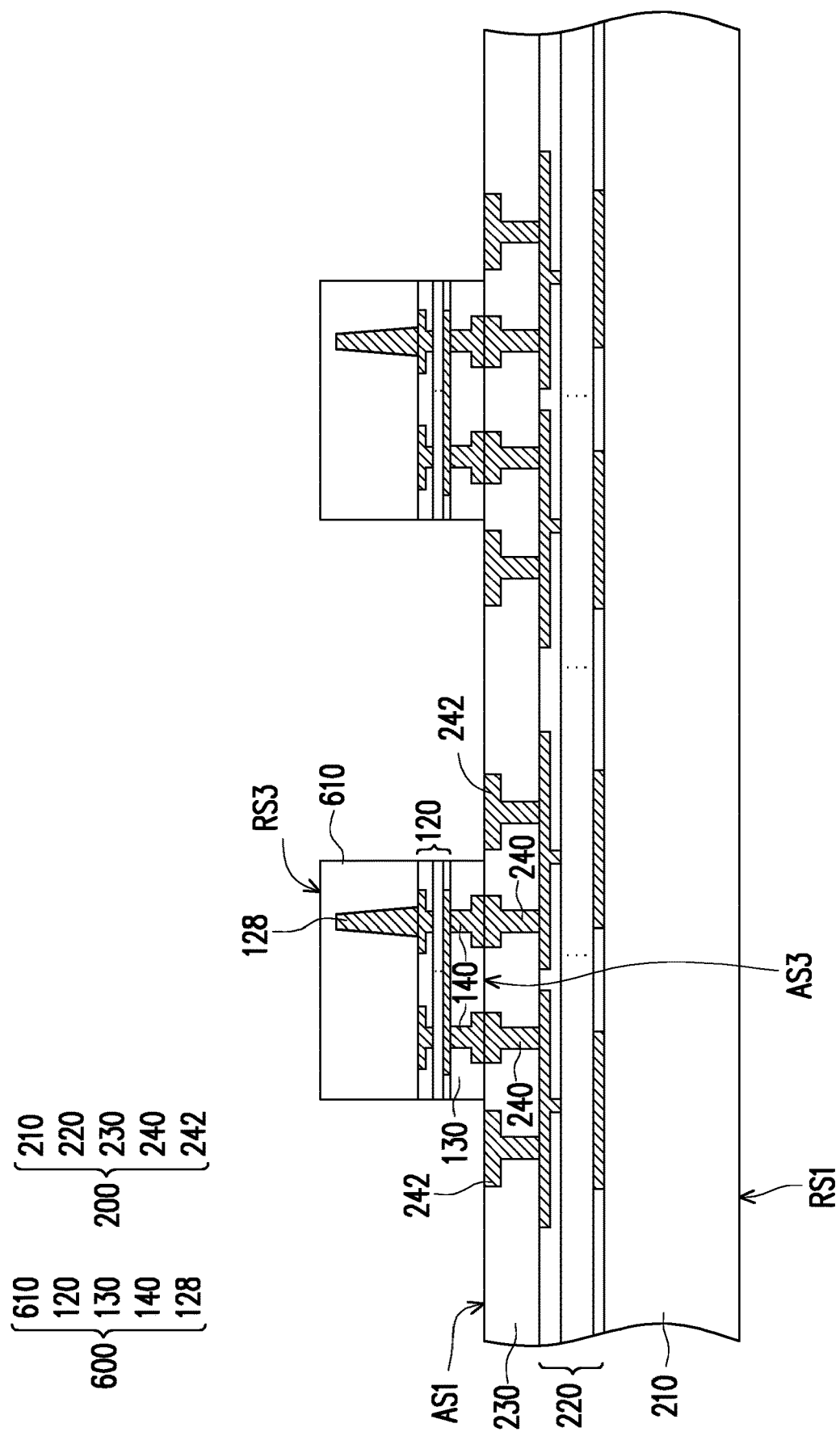
FIG. 6A to FIG. 6D are schematic cross-sectional views illustrating some process steps for a fabricating method of a semiconductor device in accordance with some alternative embodiments of the disclosure.

Referring to FIG. 6A, a plurality of semiconductor dies 600 are provided and bonded on a wafer 200. In some embodiments, the wafer 200 may include a semiconductor substrate 210 having a plurality of semiconductor devices and a plurality of through semiconductor vias formed therein, an interconnection structure 220 disposed on the semiconductor substrate 210, a dielectric layer 230 covering the interconnection structure 220, a plurality of conductors 240 embedded in the dielectric layer 230 and a plurality of conductors 242 embedded in the dielectric layer 230. As shown in FIG. 6A, the wafer 200 may include an active surface AS1 and a rear surface RS1 opposite to the active surface AS1.

In some embodiments, each one of the semiconductor dies 600 may respectively include a semiconductor substrate 610 having a plurality of semiconductor devices formed therein, an interconnection structure 120 disposed on the semiconductor substrate 610, a dielectric layer 130 covering the interconnection structure 120, and a plurality of conductors 140 embedded in the dielectric layer 130. As shown in FIG. 6A, each one of the semiconductor dies 600 may respectively include an active surface AS3 and a rear surface RS3 opposite to the active surface AS3. In some embodiments, the material of the semiconductor substrate 610 may be crystalline silicon, crystalline germanium, crystalline silicon germanium, and/or a III-V compound semiconductor, such as GaAsP, AlInAs, AlGaAs, GaInAs, GaInP, GaInAsP, and the like. In some embodiments, the semiconductor substrate 610 may also be a bulk silicon substrate or a Silicon-On-Insulator (SOI) substrate.

In some embodiments, each one of the semiconductor dies 600 may respectively further include at least one through semiconductor via (TSV) 128 embedded in the semiconductor substrate 610. In each one of the semiconductor dies 600, the at least one through semiconductor via 128 is electrically connected to the interconnection structure 120 and extends into the semiconductor substrate 610 without penetrating the semiconductor substrate 610. In other words, in each one of the semiconductor dies 600, the at least one through semiconductor via 128 embedded in the semiconductor substrate 610 is not exposed at the rear surface RS3.

In some embodiments, the semiconductor dies 600 are hybrid bonded on the wafer 200 through a chip-to-wafer bonding tool. That is, the bonded semiconductor dies 600 and wafer 200 are collectively referred to as a hybrid bonded structure. It should be noted that the steps of bonding the semiconductor dies 600 onto the wafer 200 are similar to the steps of bonding the semiconductor dies 100 onto the wafer 200 as shown in FIG. 1A, therefore the detailed descriptions of the steps of bonding the semiconductor dies 600 onto the wafer 200 can refer to the foregoing embodiments, which are not iterated herein.

Figure 6B:
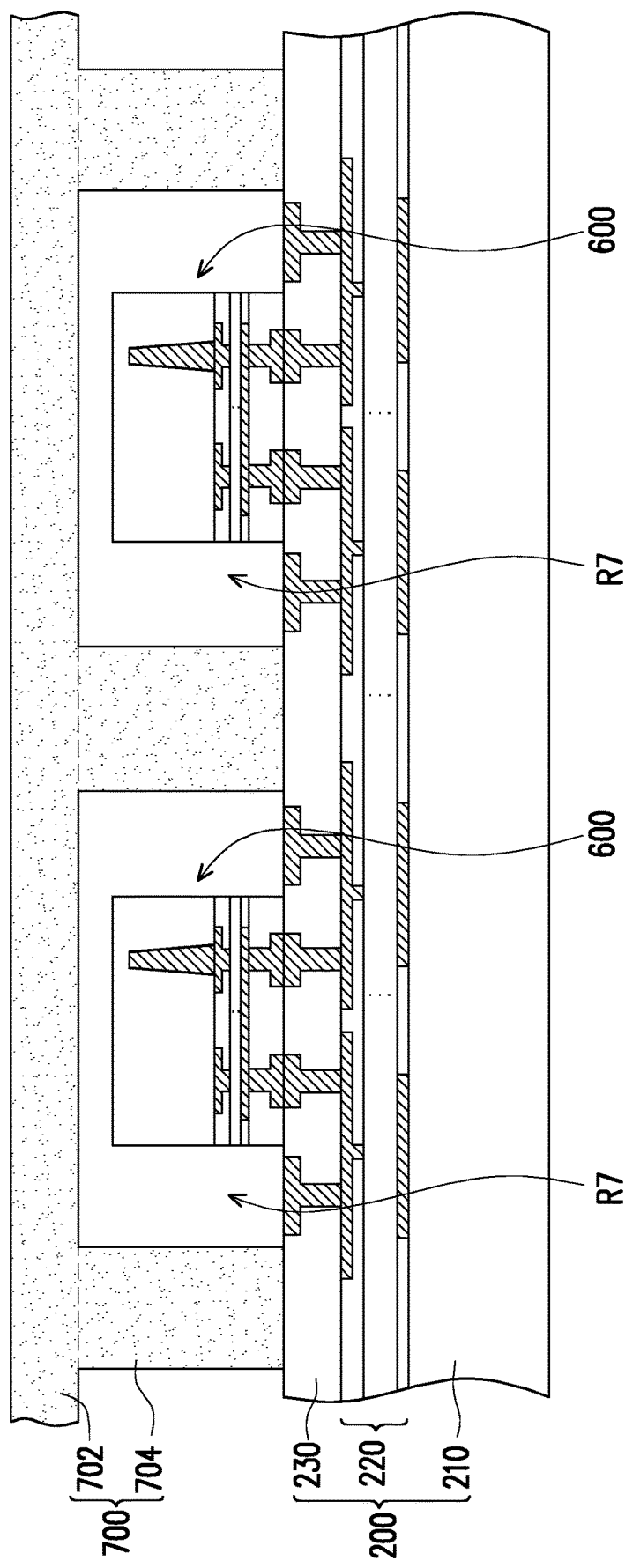

Referring to FIG. 6B, a wafer 700 is provided. In some embodiments, the wafer 700 includes a base portion 702 and at least one dummy portion 704 protruding from the base portion 702. As shown in FIG. 6B, three dummy portions 704 are formed on the base portion 702, and the wafer 700 may further include a plurality of recesses R7 between the dummy portions 704. The wafer 700 may be similar to the wafer 300, the recesses R7 may be similar to the recesses R, the base portion 702 may be similar to the base portion 302, and the at least one dummy portion 704 may be similar to the at least one dummy portion 304, so the detailed descriptions of the wafer 700, the recesses R7, the base portion 702 and the at least one dummy portion 704 are omitted herein.

As shown in FIG. 6B, the wafer 700 is flipped and the at least one dummy portion 704 of the wafer 700 is bonded to the wafer 200. In some embodiments, the at least one dummy portion 704 of the wafer 700 is bonded to the wafer 200 through a wafer-to-wafer bonding tool. It should be noted that the steps of bonding the at least one dummy portion 704 onto the wafer 200 are similar to the steps of bonding the at least one dummy portion 304 onto the wafer 200, therefore the detailed descriptions of the steps of bonding the at least one dummy portion 704 onto the wafer 200 can refer to the foregoing embodiments, which are not iterated herein.

Figure 6C:
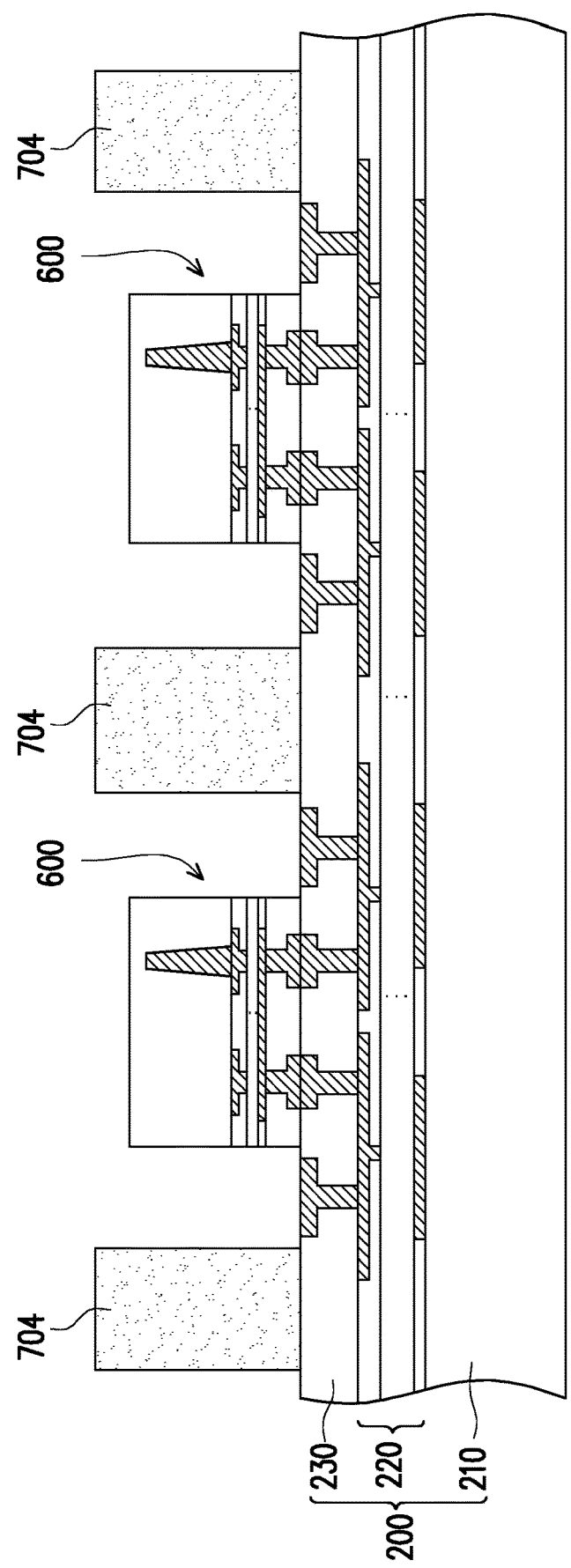

Referring to FIG. 6B and FIG. 6C, the base portion 702 is removed until the at least one dummy portion 704 and the semiconductor dies 600 are exposed. For example, the base portion 702 may be grinded until the at least one dummy portion 704 and the semiconductor dies 600 are exposed. In some embodiments, the base portion 702 is removed by a chemical mechanical polishing (CMP) process. As shown in FIG. 6B and FIG. 6C, the base portion 702 is removed and the at least one dummy portion 704 remains on the wafer 200. In other alternative embodiments, while the base portion 702 is removed until the semiconductor dies 600 are exposed, a portion of the at least one dummy portion 704 may be slightly removed as well.

Figure 6D:
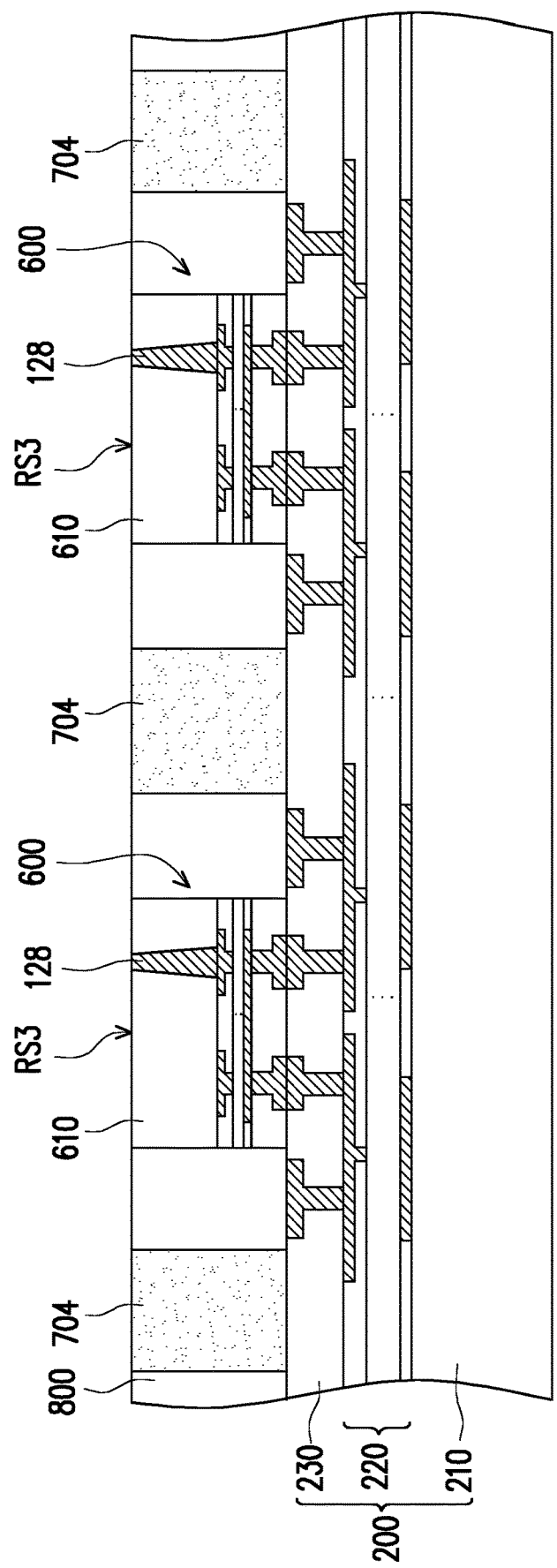

Referring to FIG. 6D, a dielectric layer 800 is formed to laterally encapsulate the semiconductor dies 600 and the at least one dummy portion 704. The dielectric layer 800 may be similar to the dielectric layer 410, so some of the detailed descriptions thereof are omitted herein. In some embodiments, the dielectric layer 800 may be formed by the following steps. First, a dielectric material layer (not shown) may be formed over the wafer 200 to cover the semiconductor dies 600 and the at least one dummy portion 704, wherein the maximum thickness of the dielectric material layer may be greater than the thickness of the semiconductor dies 600 and the thickness of the at least one dummy portion 704. In some embodiments, the dielectric material layer may be formed by chemical vapor deposition (CVD), plasma-enhanced chemical vapor deposition (PECVD), or other suitable deposition processes. In some embodiment, the dielectric material layer may be a single-layered structure and the material of the dielectric material layer may include silicon oxide, silicon nitride, and/or tetraethoxysilane (TEOS). However, the disclosure is not limited thereto. In some alternative embodiments, the dielectric material layer may be a multi-layered structure and include a plurality of stacked layers. Thereafter, a grinding or polishing process is performed on the dielectric material layer so as to partially remove the dielectric material layer and the semiconductor substrates 610 of the semiconductor dies 600 until the through semiconductor vias 128 and the rear surfaces RS3 of the semiconductor dies 600 are exposed to render the dielectric layer 800. In some embodiments, the dielectric material layer and the semiconductor substrates 610 of the semiconductor dies 600 may be partially removed by a chemical mechanical polishing (CMP) process, a mechanical grinding process, the combination thereof or other suitable removal processes.

It should be noted that the structure illustrated in FIG. 6D is same as the structure illustrated in FIG. 1E, therefore after the structure illustrated in FIG. 6D is formed, the steps illustrated in FIG. 1F to FIG. 1H may be performed to form a plurality of semiconductor devices.

In accordance with some embodiments of the disclosure, a method of fabricating a semiconductor device including the following steps is provided. A hybrid bonded structure is provided. A cover lid comprising a base portion and at least one dummy portion protruding from the base portion is provided. The at least one dummy portion of the cover lid is bonded to the hybrid bonding structure. The base portion is removed. A redistribution structure over the hybrid bonding structure and the at least one dummy portion is formed.

In accordance with some embodiments of the disclosure, a method of fabricating a semiconductor device including the following steps is provided. A plurality of semiconductor dies are bonded on a first wafer. A second wafer comprising a base portion and at least one dummy portion protruding from the base portion is provided. The at least one dummy portion of the second wafer is bonded to the first wafer such that the plurality of semiconductor dies are covered by the base portion of the second wafer. The base portion is removed. A redistribution structure over the first wafer, the plurality of semiconductor dies and the at least one dummy portion is formed.

In accordance with some embodiments of the disclosure, a method of fabricating a semiconductor device including the following steps is provided. A plurality of semiconductor dies are bonded on the first wafer. A second wafer comprising a plurality of recesses is provided. The second wafer is bonded to the first wafer such that the plurality of semiconductor dies are accommodated in the plurality of recesses. A portion of the second wafer is removed until the plurality of semiconductor dies are exposed to form at least one dummy portion on the first wafer. A redistribution structure over the first wafer, and the plurality of semiconductor dies and the at least one dummy portion is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
providing a hybrid bonded structure;
providing a cover lid comprising a base portion and at least one dummy portion protruding from the base portion;
bonding the at least one dummy portion of the cover lid to the hybrid bonding structure;
removing the base portion; and
forming a redistribution structure over the hybrid bonding structure and the at least one dummy portion.

2. The method as claimed in claim 1, wherein providing the cover lid comprises:
partially removing portions of a semiconductor substrate to form the base portion and the at least one dummy portion, wherein roughness of side surfaces of the at least one dummy portion ranges between about 0.1 µm and about 0.5 µm.

3. The method as claimed in claim 2, wherein partially removing portions of the semiconductor substrate comprises performing an etching process.

4. The method as claimed in claim 1, wherein the cover lid is bonded on the hybrid bonding structure through a wafer-to-wafer bonding tool.

5. A method of fabricating a semiconductor device, comprising:
bonding a plurality of semiconductor dies on a first wafer;
providing a second wafer comprising a base portion and at least one dummy portion protruding from the base portion;
bonding the at least one dummy portion of the second wafer to the first wafer such that the plurality of semiconductor dies are covered by the base portion of the second wafer;
removing the base portion; and
forming a redistribution structure over the first wafer, the plurality of semiconductor dies and the at least one dummy portion.

6. The method as claimed in claim 5, wherein providing the second wafer comprises:
partially removing portions of a semiconductor substrate to form the base portion and the at least one dummy portion, wherein roughness of side surfaces of the at least one dummy portion ranges between about 0.1 μm and about 0.5 μm.

7. The method as claimed in claim 5, wherein the semiconductor dies are arranged in a plurality of columns and the at least one dummy portion comprises:
at least one first dummy portion disposed between two adjacent columns among the plurality of columns; and
at least one second dummy portion disposed aside of the at least one first dummy portion, an outermost column among the plurality of columns being between the at least one first dummy portion and the at least one second dummy portion.

8. The method as claimed in claim 7, wherein the at least one first dummy portion comprises at least one first dummy strip extending along an extending direction substantially parallel to the plurality of columns, and the at least one second dummy portion comprises at least one second dummy strip extending along the extending direction.

9. The method as claimed in claim 8, wherein dimension of the at least one first dummy strip in the extending direction is substantially equal to or greater than dimension of one column among the plurality of columns in the extending direction.

10. The method as claimed in claim 7, wherein the at least one dummy portion further comprises:
at least one third dummy portion, disposed between an edge of the first wafer and a die bonding area where the semiconductor dies are distributed.

11. The method as claimed in claim 10, wherein the at least one third dummy portion is separated from the at least one first dummy portion, and the at least one third dummy portion is separated from the at least one second dummy portion.

12. The method as claimed in claim 10, wherein the at least one third dummy portion is connected with the at least one first dummy portion, and the at least one third dummy portion is separated from the at least one second dummy portion.

13. The method as claimed in claim 5, wherein the at least one dummy portion is a dummy frame having a plurality of openings exposing the plurality of semiconductor dies.

14. The method as claimed in claim 5, wherein the plurality of semiconductor dies are hybrid bonded on the first wafer through a chip-to-wafer bonding tool.

15. The method as claimed in claim 5, wherein the at least one dummy portion of the second wafer is bonded on the first wafer through a wafer-to-wafer bonding tool.

16. A method of fabricating a semiconductor device, comprising:
bonding a plurality of semiconductor dies on the first wafer;
providing a second wafer comprising a plurality of recesses;
bonding the second wafer to the first wafer such that the plurality of semiconductor dies are accommodated in the plurality of recesses;
removing a portion of the second wafer until the plurality of semiconductor dies are exposed to form at least one dummy portion on the first wafer; and
forming a redistribution structure over the first wafer, the plurality of semiconductor dies and the at least one dummy portion.

17. The method as claimed in claim 16, wherein providing the second wafer comprise:
partially removing portions of a semiconductor substrate to form the plurality of recesses, wherein roughness of sidewalls of the plurality of recesses ranges between about 0.1 μm and about 0.5 μm.

18. The method as claimed in claim 16, wherein each one of the plurality of semiconductor dies has at least one through semiconductor via electrically connected to the redistribution structure.

19. The method as claimed in claim 16, wherein forming the redistribution structure comprises:
forming a dielectric layer, laterally encapsulating the plurality of semiconductor dies and the at least one dummy portion;
forming at least one conductive via, penetrating through the dielectric layer; and
forming a redistribution circuit layer, electrically connected to the plurality of semiconductor dies and the at least one conductive via.

20. The method as claimed in claim 19, wherein each one of the plurality of semiconductor dies has at least one through semiconductor via electrically connected to the at least one conductive via of the redistribution structure.

* * * * *